United States Patent
Fraczak et al.

(10) Patent No.: US 9,773,978 B1
(45) Date of Patent: Sep. 26, 2017

(54) OPTIMAL DEVICE STRUCTURES FOR BACK-END-OF-LINE COMPATIBLE MIXED IONIC ELECTRONIC CONDUCTORS MATERIALS

(71) Applicant: International Business Machines Corporation, Armonk, NY (US)

(72) Inventors: Gloria Wing Yun Fraczak, Bellerose, NY (US); Hiroyuki Miyazoe, White Plains, NY (US); Kumar Virwani, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/225,914

(22) Filed: Aug. 2, 2016

(51) Int. Cl.
| | |
|---|---|
| H01L 45/00 | (2006.01) |
| H01L 29/16 | (2006.01) |
| H01L 21/00 | (2006.01) |
| H01L 27/24 | (2006.01) |

(52) U.S. Cl.
CPC .......... *H01L 45/1266* (2013.01); *H01L 27/24* (2013.01); *H01L 45/08* (2013.01); *H01L 45/1233* (2013.01); *H01L 45/142* (2013.01); *H01L 45/143* (2013.01)

(58) Field of Classification Search
CPC . H01L 45/1266; H01L 45/1233; H01L 45/08; H01L 45/142; H01L 45/143; H01L 27/24
USPC .......................................................... 257/4
See application file for complete search history.

(56) References Cited

U.S. PATENT DOCUMENTS

| | | | | |
|---|---|---|---|---|
| 6,465,867 | B1* | 10/2002 | Bernard | H01L 21/76843 257/506 |
| 6,482,656 | B1* | 11/2002 | Lopatin | H01L 21/288 257/E21.174 |
| 8,830,725 | B2 | 9/2014 | Bethune et al. | |
| 2011/0227023 | A1* | 9/2011 | Bethune | H01L 45/00 257/4 |
| 2011/0266513 | A1* | 11/2011 | Williams | G11C 13/0007 257/4 |
| 2015/0122315 | A1* | 5/2015 | Shin | H01L 29/73 136/255 |
| 2015/0380642 | A1* | 12/2015 | Rinerson | G06F 17/5045 257/4 |
| 2016/0248009 | A1* | 8/2016 | Lee | H01L 45/1253 |
| 2016/0343670 | A1* | 11/2016 | Lee | H01L 23/53276 |

OTHER PUBLICATIONS

List of IBM Patents or Patent Applications Treated as Related, dated Aug. 2, 2016, 2 pages.

* cited by examiner

*Primary Examiner* — Dao H Nguyen
(74) *Attorney, Agent, or Firm* — Scully, Scott, Murphy & Presser, P.C.; Louis J. Percello, Esq.

(57) ABSTRACT

A mixed ionic electron conductor (MIEC)-based memory cell access device is provided. The MIEC-based memory cell access device includes a MIEC material portion located between a bottom electrode and a top electrode. A contact area between the MIEC material portion and the bottom electrode is substantially the same as a contact area between the MIEC material portion and the top electrode.

19 Claims, 6 Drawing Sheets

OPTIMAL DEVICE STRUCTURES FOR BACK-END-OF-LINE COMPATIBLE MIXED IONIC ELECTRONIC CONDUCTORS MATERIALS

BACKGROUND

The present application relates to integrated circuits, and more particularly, to mixed ionic electronic conductor-based memory cell access devices formed using a subtractive etch process.

Mixed ionic electronic conductors (MIEC) are being explored as access devices for non-volatile memories such as, for example, phase-change memory, resistive random access memory, and spin-torque transfer random access memory. MIEC-based access devices having high voltage margins for use in large memory arrays are desirable. Study shows that MIEC voltage margins increase as the confined volume of MIEC material decreases.

The MIEC-based memory cell access devices are typically formed using an additive damascene process in which a dielectric material layer is patterned to include vias therein. The MIEC material is subsequently deposited within the vias and thereafter any MIEC material that is located outside the vias is removed utilizing a planarization process, e.g., chemical mechanical planarization (CMP).

Figure 1:
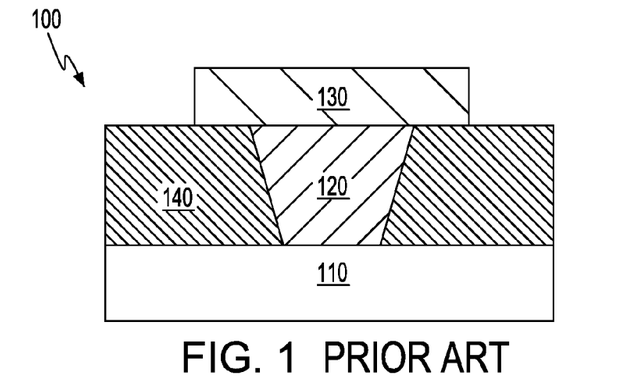
FIG. 1 is a cross-sectional view of a MIEC-based access device formed using a prior art additive damascene process.

FIG. 1 shows a MIEC-based memory cell access device 100 formed by the additive damascene process. The MIEC-based memory cell access device 100 includes a MIEC material portion 120 sandwiched between a bottom electrode 110 and a top electrode 130. The MIEC material portion 120 is formed by filling a via formed in a dielectric material layer 140. Several issues are associated with this conventional damascene process in forming the MIEC-based memory cell access device 100. First, the via etching process typically forms a via having a tapered profile; the MIEC material portion 120 formed within the via is also tapered to have a smaller cross-section area at the bottom of the MIEC material portion 120 than at the top of the MIEC material portion 120. Thus, the contact area between the MIEC material portion 120 and the bottom electrode 110 is smaller than that between the MIEC material portion 120 and the top electrode 130. The different contact areas lead to asymmetric current vs. voltage (I-V) characteristics during bi-directional electrical operation of the access device. This device asymmetry also results in an increase in the low leakage current of the access device. Moreover, it is known that the CMP process that is employed to remove the excess MIEC material from the top of the dielectric material layer 140 forms surface defects on the MIEC material portion 120, which adversely affect the device performance. Therefore a need exists to overcome the problems with the prior art as discussed above.

SUMMARY

The present application provides MIEC-based memory cell access devices formed using a subtractive etch process.

In one embodiment, the semiconductor structure includes a memory cell access device. The memory cell access device includes a mixed-ionic electronic conductor (MIEC) material portion located between a bottom electrode and a top electrode. A contact area between the MIEC material portion and the bottom electrode is substantially the same as a contact area between the MIEC material portion and the top electrode.

In another embodiment, the semiconductor structure includes a memory cell access device. The memory cell access device includes a bottom electrode, vertically stacked mixed ion electron conductor (MIEC) material portions located over the bottom electrode. The MIEC material portions are separated from one another by metal portions, and a bottommost MIEC material portion in the vertically stacked MIEC material portions is in direct contact with the bottom electrode. The memory cell access device further includes a top electrode located on and in direct contact with a topmost MIEC material portion in the vertically stacked MIEC material portions.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 2:
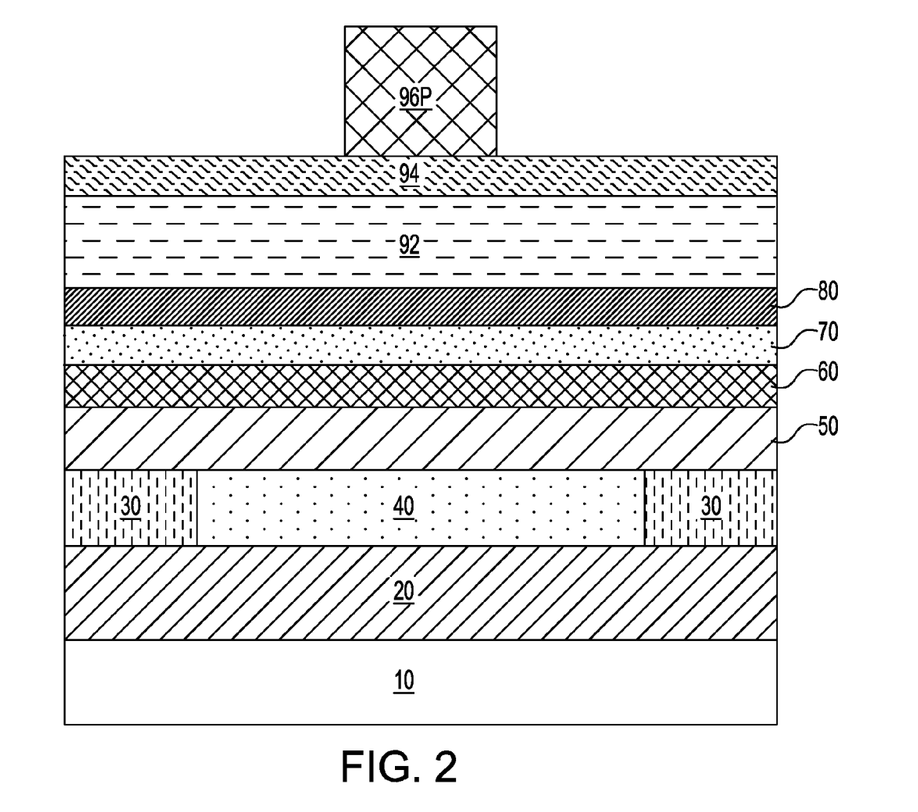
FIG. 2 is a cross-section view of a first exemplary semiconductor structure according to a first embodiment of the present application after forming a first material stack over a substrate; the first material stack includes, from bottom to top, a first dielectric material layer, a second dielectric material layer having a bottom electrode embedded there in, a MIEC material layer, a metal layer, a metallic hard mask layer, a dielectric hard mask layer, an organic planarization layer (OPL), an antireflective hard mask layer and a photoresist portion.

Referring to FIG. 2, a first exemplary semiconductor structure according to a first embodiment of the present application includes a first material stack formed over a substrate 10. The first material stack includes, from bottom to top, a first dielectric material layer 20, a second dielectric material layer 30 having a bottom electrode 40 embedded therein, a MIEC material layer 50, a metal layer 60, a metallic hard mask layer 70, a dielectric hard mask layer 80, an organic planarization layer (OPL) 92, an antireflective hard mask layer 94 and a photoresist portion 96P.

The substrate 10 may be composed of a semiconductor material. Exemplary semiconductor materials that may be used as substrate 10 include, but are not limited to, Si, SiGe, SiGeC, SiC, Ge alloys GaAs, InAs, InP, carbon-containing materials such as, for example, carbon nanotubes and graphene, and other III/V or II/VI compound semiconductors. In one embodiment, the semiconductor material which can be employed as substrate 10 may be present in a bulk semiconductor substrate. In another embodiment, the semiconductor material which can be employed as substrate 10 may be a topmost layer of a multilayered semiconductor material stack. In yet another embodiment, the semiconductor material that can be employed as substrate 10 can be a topmost layer of a semiconductor-on-insulator substrate.

In some embodiments, the semiconductor material that can be employed as substrate 10 can be single crystalline (i.e., a material in which the crystal lattice of the entire sample is continuous and unbroken to the edges of the sample, with no grain boundaries). In another embodiment, the semiconductor material that can be employed as substrate 10 can be polycrystalline (i.e., a material that is composed of many crystallites of varying size and orientation; the variation in direction can be random (called random texture) or directed, possibly due to growth and processing conditions). In yet another embodiment of the present application, the semiconductor material that can be employed as substrate 10 can be amorphous (i.e., a non-crystalline material that lacks the long-range order characteristic of a crystal). Typically, the semiconductor material that can be employed as substrate 10 is a single crystalline semiconductor material, such as, for example, single crystalline silicon.

The substrate 10 may be doped, undoped or contain doped and undoped regions therein. For clarity, the doped regions are not specifically shown in substrate 10. Each doped region within the substrate 10 may have the same, or they may have different conductivities and/or doping concentrations.

The substrate 10 can be processed utilizing techniques known in the art to include one or more semiconductor devices such as, for example, transistors, capacitors, diodes, resistors, or other components that are part of integrated circuits. For clarity, the semiconductor devices are not shown in the drawings of the present application.

The first dielectric material layer 20 is formed on the substrate 10. The first dielectric material layer 20 may include a dielectric material such as, for example, silicon dioxide, silicon nitride, or silicon oxynitride. In some embodiments of the present application, the first dielectric material layer 20 may also include a low-k dielectric material having a dielectric constant that is about 4.0 or less. Exemplary low-k dielectric materials include, but are not limited to, organosilicates, silsequioxanes, undoped silicate glass (USG), fluorosilicate glass (FSG), tetraethylorthosilicate (TEOS), SiCOH or borophosphosilicate glass (BPSG). The first dielectric material layer 20 may be formed by chemical vapor deposition (CVD), plasma enhanced chemical vapor deposition (PECVD) or spin coating. The thickness of the first dielectric material layer 20 may be from 100 nm to 1,000 nm, although lesser and greater thicknesses can also be employed.

The first dielectric material layer 20 may include interconnect structures (not shown) to provide electric connections among electric components formed in the substrate 10. The first dielectric material layer 20 may also include memory cells (not shown) embedded therein. For clarity, the interconnect structures and memory cells are not shown in the drawings of the present application.

The second dielectric material layer 30 is formed on the first dielectric material layer 20. The second dielectric material layer 30 may include a dielectric material that is the same as, or different from, the dielectric material of the first dielectric material layer 20. In one embodiment, the second dielectric material layer 30 is composed of a dielectric material that can be selectively etched with respect to the first dielectric material layer 20. For example and when the first dielectric material layer 20 is composed of a dielectric oxide, the second dielectric material layer 30 may be composed of silicon nitride. The second dielectric material layer 30 may be formed by CVD, PECVD or spin coating. The thickness of the second dielectric material layer 30 may be from 10 nm to 1,000 nm, although lesser and greater thicknesses can also be employed.

Following the deposition of the second dielectric material layer 30, the bottom electrode 40 is formed within the second dielectric material layer 30. The bottom electrode 40 is laterally surrounded by the second dielectric material layer 30. In some embodiments of the present application, the bottom electrode 40 can be a top electrode of a memory cell. The bottom electrode 40 may include any suitable conductive material such as, for example, TiN, TaN, W, Al, Cu, Ag, Ir, Pt, Au, Co or Ni. In one embodiment, the bottom electrode 40 can be formed by first patterning the second dielectric material layer 30, utilizing lithography and etching processes known in the art, to provide an opening (not shown) that extends through the second dielectric material layer 30. The lithographic step may include applying a photoresist layer (not shown) to the second dielectric material layer 30, exposing the photoresist layer to a pattern of radiation and developing the pattern into the exposed photoresist layer unitizing a resist developer. The etching step performed to transfer the pattern from the patterned photoresist layer into the second dielectric material layer 30 can include an anisotropic etch which can be a dry etch such as, for example, reactive ion etch (RIE) or a wet etch. After the etch, the patterned photoresist layer can be removed from the structure utilizing a resist stripping process such as, for example, ashing. The opening is then filled with the conductive material by a conventional deposition method such as, for example, CVD, physical vapor deposition (PVD) or plating. The excess conductive material is subsequently removed from the top surface of the second dielectric material layer 30, for example, by CMP. The bottom electrode 40 thus formed has a top surface coplanar with the top surface of the second dielectric material layer 30.

The MIEC material layer 50 is formed on the second dielectric material layer 30 and the bottom electrode 40 as a blanket layer (i.e., as an unpatterned contiguous layer). The MIEC material layer 50 may include a material that is capable of conducting both ions and electronic charge carriers (electrons and/or holes). For example, the MIEC material layer 50 may be composed of a material represented by a formula of $M_aX_bY_c$, wherein M is a metallic element including but not limited to Cu, Ag, Li, or Zn, X is a Group XIV element including, but not limited to, Ge, Si, Sn or C or a Group VIB transition metal including but not limited to Cr, Mo or W, and Y is a Group XVI or chalcogen element including but not limited to S, Se, Te or O, and wherein a is from 20 to 70 atomic %, b is from 4 to 30 atomic %, and c is from 30 to 60 atomic %. In one embodiment, the MIEC material layer 50 includes $Cu_8GeS_6$ or $Cu_8GeSe_6$. In some embodiments, combinations of the various elements mentioned above, such as $Ag_{4.7}Cu_{3.3}GeS_6$, could also be used as the MIEC layer 50. The MIEC material layer 50 can be deposited, for example, by PVD, CVD or atomic layer deposition (ALD). The deposition temperature of the MIEC material is typically below 400° C., thus is compatible with low-temperature back-end-of-line (BEOL) semiconductor processing conditions. The thickness of the MIEC material layer 50 that is formed can be from 10 nm to 200 nm, although lesser and greater thicknesses can also be employed.

The metal layer 60 is formed on the MIEC material layer 50 as a blanket layer. The metal layer 60 may include a conductive material that can withstand the etch chemistry employed to etch the overlying metallic hard mask layer 70, thus acting as a barrier to prevent damage to the MIEC material layer 50 during the etching of the metallic hard mask layer 70 subsequently performed. In one embodiment, the metal layer 60 may include Ru, Cu, Ag, Au, Ni, Fe, Pt, Pd, W, Ir or Co. The metal layer 60 may be formed utilizing a conventional deposition method such as, for example, CVD, PECVD or ALD.

The metallic hard mask layer 70 is formed on the metal layer 60 as a blanket layer. The metallic hard mask layer 70 may include a metal nitride, a metal carbide, an elemental metal, an intermetallic alloy, or a combination or a stack thereof. In one embodiment, the metallic hard mask layer 70 includes a metal nitride such as TiN, TaN, WN or an alloy thereof. The metallic hard mask layer 70 may be deposited, for example, by CVD or PVD. The thickness of the metallic hard mask layer 70 can be from 10 to 200 nm, although lesser and greater thickness can also be employed.

The dielectric hard mask layer 80 is formed on the metallic hard mask layer 70 as a blanket layer. The dielectric hard mask layer 80 may include a dielectric oxide or dielectric nitride. In one embodiment, the dielectric hard mask layer 80 is composed of silicon dioxide. The dielectric hard mask layer 80 may be formed, for example, by CVD, PECVD or ALD. The thickness of the dielectric hard mask layer 80 can be from 10 nm to 50 nm, although lesser and greater thicknesses can also be employed.

The OPL 92 is formed on the dielectric hard mask layer 80 as a blanket layer. The OPL 92 may include an organic planarization material, which is a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the OPL 92 forms a planar horizontal surface. Exemplary organic planarization materials include, but are not limited to, near-frictionless carbon (NFC) material, diamond-like carbon, polyarylene ether, and polyimide. The OPL 92 can be deposited, for example, by spin coating. The thickness of the OPL 92 can be from 100 nm to 500 nm, although lesser and greater thicknesses can also be employed.

The antireflective hard mask layer 94 is formed on the OPL 92 as a blanket layer. The antireflective hard mask layer 94 may include an antireflective coating material as known in the art. The antireflective hard mask layer 94 is employed in the lithographic process to improve the photoresist profile and to reduce the line width variation caused by scattering and reflecting light. The antireflective hard mask layer 94 may include a silicon-containing antireflective coating (SiARC) material, a titanium-containing antireflective coating material (TiARC), silicon nitride, silicon oxide or TiN. In one embodiment, the antireflective hard mask layer 94 is composed of a SiARC material. The antireflective hard mask layer 94 can be applied, for example, by spin coating or CVD. The thickness of the antireflective hard mask layer 94 can be from 10 nm to 150 nm, although lesser and greater thicknesses can also be employed.

A photoresist layer (not shown) is deposited as a blanket layer atop the antireflective hard mask layer 94, for example, by spin coating. The photoresist layer may include any conventional organic photoresist material such as, for example, methacrylates or polyesters. The photoresist layer may have a thickness from 30 nm to 500 nm, although lesser and greater thicknesses can also be employed. The photoresist layer is then lithographically patterned into a predetermined shape forming the photoresist portion 96P atop the antireflective hard mask layer 94.

Figure 3:
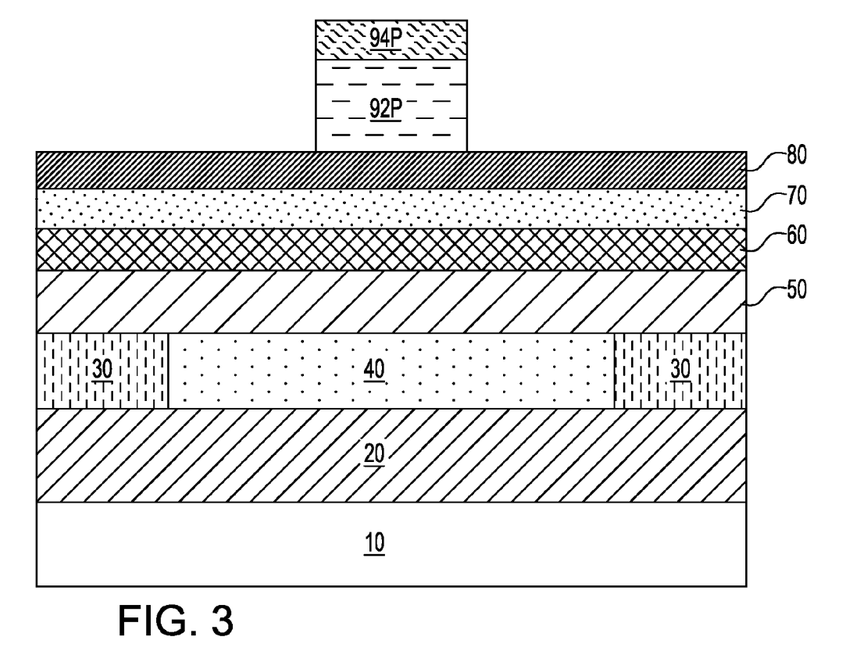
FIG. 3 is a cross-sectional view of the first exemplary semiconductor structure of FIG. 2 after forming an antireflective hard mask portion and an OPL portion by patterning the antireflective hard mask layer and the OPL using the photoresist portion as an etch mask.

Referring to FIG. 3, the antireflective hard mask layer 94 and the OPL 92 are patterned using the photoresist portion 96P as an etch mask. The patterning of the antireflective hard mask layer 94 and the OPL layer 92 can include a dry etch such as, for example, RIE, plasma etch, or ion beam etch that removes materials that provide the antireflective hard mask layer 94 and the OPL 92 selective to the dielectric material that provides the dielectric hard mask layer 80. In one embodiment, a RIE process employing at least one hydrofluorocarbon gas and/or at least one hydrochlorocarbon gas as an etchant may be performed to removing portions of the antireflective hard mask layer 94 and the OPL 92 that are not covered by the photoresist portion 96P. The remaining portion of the antireflective hard mask layer 94 is herein referred to as an antireflective hard mask portion 94P. The remaining portion of the OPL 92 is herein referred to as an OPL portion 92P. In one embodiment and as shown in FIG. 3, sidewalls of the antireflective hard mask portion 94P and the OPL portion 92P are vertically aligned to sidewalls of the photoresist portion 96P. The photoresist portion 96P can be removed during the patterning of the antireflective hard mask layer 94 and the OPL 92.

Figure 4:
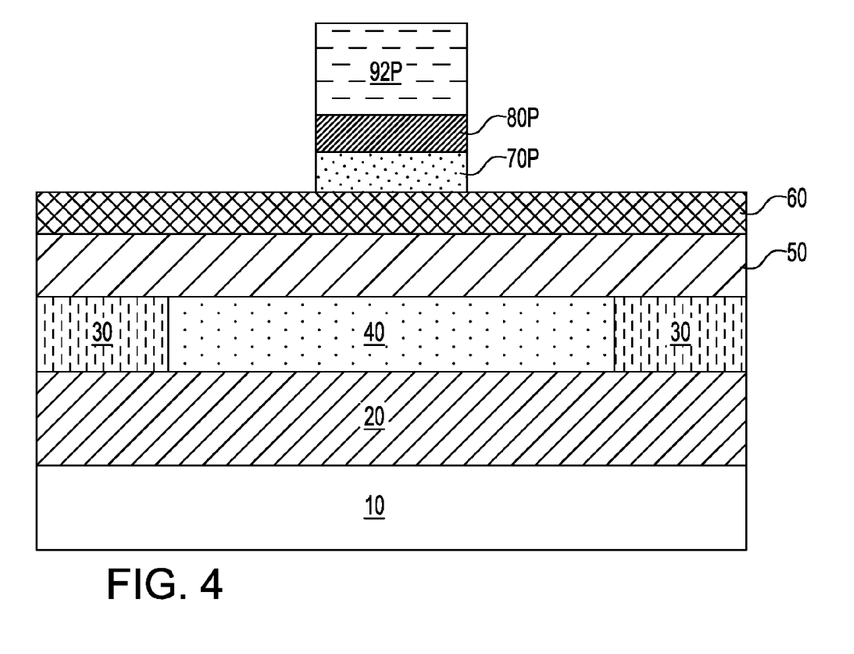
FIG. 4 is a cross-sectional view of the first exemplary semiconductor structure of FIG. 3 after forming a dielectric hard mask portion and a metallic hard mask portion by patterning the dielectric hard mask layer and the metallic hard mask layer using the OPL portion as an etch mask.

Referring to FIG. 4, the dielectric hard mask layer 80 is patterned using the OPL portion 92P as an etch mask. The patterning of the dielectric hard mask layer 80 can include a dry etch such as, for example, RIE, plasma etch, or ion beam etch that removes the dielectric material that provides the dielectric hard mask layer 80 selective to the metal that provides the metallic hard mask layer 70. After the etch, the remaining portion of the dielectric hard mask layer 80 is herein referred to as a dielectric hard mask portion 80P.

Subsequently, the metallic hard mask layer 70 is patterned using the OPL portion 92P as an etch mask. The patterning of the metallic hard mask layer 70 can include a dry etch such as, for example, RIE, plasma etch, or ion beam etch that removes the metal that provides the metallic hard mask layer 70 selective to the metal that provides the metal layer 60. In one embodiment, the metallic hard mask layer 70 can be etched with a RIE process employing chlorine ($Cl_2$) gas or chlorine-containing gases as an etchant. After the etch, the remaining portion of the metallic hard mask layer 70 is herein referred to as a metallic hard mask portion 70P. In one embodiment and as shown in FIG. 4, after patterning sidewalls of the dielectric hard mask portion 80P and the metallic hard mask portion 70P are vertically aligned to the sidewalls of the OPL portion 92P.

The antireflective hard mask portion 94P is removed by the etch chemistries employed to etch the dielectric hard mask layer 80 and the metallic hard mask layer 70. Any OPL portion 92P remained after the dry etches can be subsequently, removed, for example, by plasma ashing.

Figure 5:
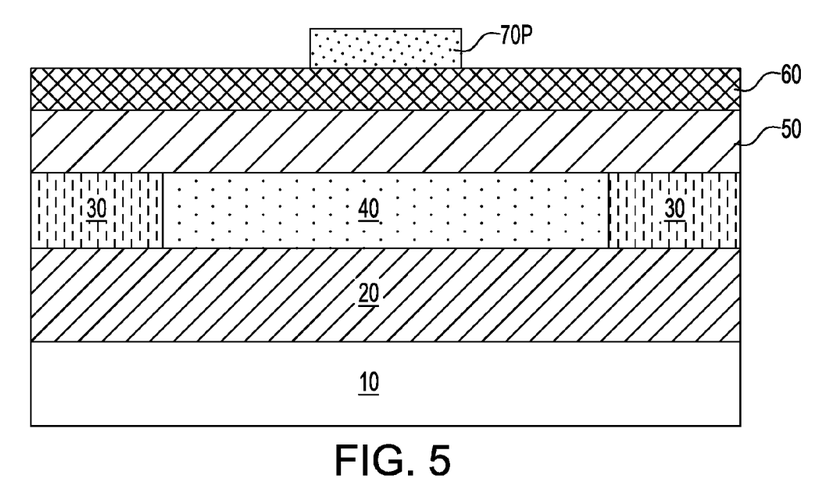
FIG. 5 is a cross-sectional view of the first exemplary semiconductor structure of FIG. 4 after removing the dielectric hard mask portion.

Referring to FIG. 5, the dielectric hard mask portion 80P is removed from the structure, leaving the metallic hard mask portion 70P atop the metal layer 60. In one embodiment, the dielectric hard mask portion 80P can be removed employing a planarization process such as, for example, CMP and/or grinding. In another embodiment, a wet etch can be used to remove dielectric hard mask portion 80P from the structure. For example, the dielectric hard mask portion 80P can be removed utilizing a diluted HF solution.

Figure 6:
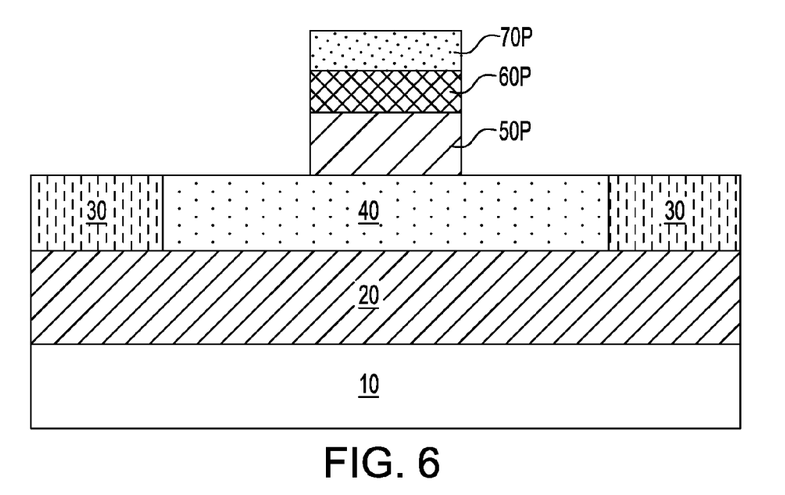
FIG. 6 is a cross-sectional view of the first exemplary semiconductor structure of FIG. 5 after forming a metal portion and a MIEC material portion by simultaneously patterning the metal layer and the MIEC material layer using the metallic hard mask portion as an etch mask.

Referring to FIG. 6, the metal layer 60 and the MIEC material layer 50 are simultaneously patterned using the metallic hard mask portion 70P as an etch mask. The patterning of the metal layer 60 and the MIEC material layer 50 can include a dry etch such as, for example, RIE, plasma etch, or ion beam etch that removes the metal that provides the metal layer 60 and the material that provides the MIEC material layer 50 selective to the metal that provides the bottom electrode 40 and the dielectric material that provides the second dielectric material layer 30. In one embodiment, the top electrode layer 60 and the MIEC material layer 50 can be simultaneously etched with a RIE process employing one or more gases comprised of C, H, and O such as $CH_3OH$, $C_2H_5OH$ or a gas mixture containing $NH_3$ and CO, $NH_3$ and $CH_4$ or $CH_3$ and $C_2H_4$ as an etchant. Peripheral portions of the bottom electrode 40 are exposed after the etch.

After the etch, the remaining portion of the metal layer 60 is herein referred to as a metal portion 60P, and the remaining portion of the MIEC material layer 50 is herein referred to as a MIEC material portion 50P. In one embodiment and as shown in FIG. 6, sidewalls of the metal portion 60P and the MIEC material portion 50P are vertically aligned to the sidewalls of the metallic hard mask portion 70P.

Figure 7:
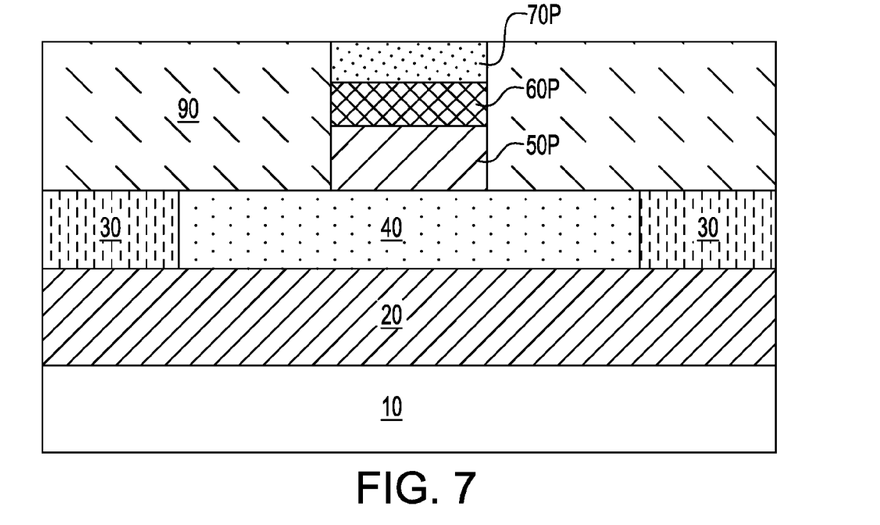
FIG. 7 is a cross-sectional view of the first exemplary semiconductor structure of FIG. 6 after forming an interlevel dielectric (ILD) layer to laterally surround the MIEC material portion, the metal portion and the metallic hard mask portion according to one embodiment of the present application.
Figure 8:
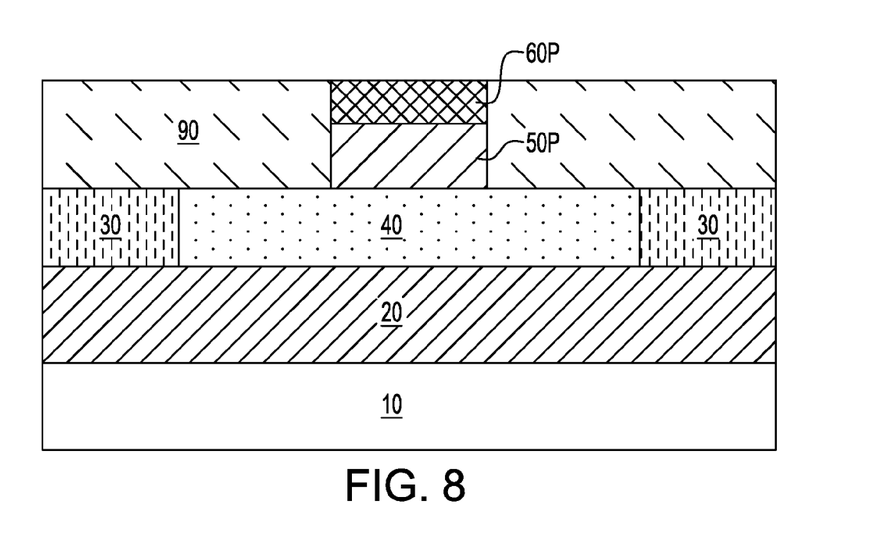
FIG. 8 is a cross-sectional view of the first exemplary semiconductor structure of FIG. 6 after forming an ILD layer to laterally surround the MIEC material portion and the metal portion according to another embodiment of the present application.

Referring to FIG. 7, an interlevel dielectric (ILD) layer 90 is formed on the bottom electrode 40 and the second dielectric material layer 30. The ILD layer 90 may include a dielectric material that can be easily planarized. For example, the ILD layer 90 can be a doped silicate glass, an undoped silicate glass (silicon oxide), an organosilicate glass (OSG), silicon nitride, silicon oxynitride, or a porous dielectric material. The ILD layer 90 can be formed by CVD, PVD or spin coating. The thickness of the ILD layer 90 can be selected so that an entirety of the top surface of the ILD layer 90 is initially formed above the top surface of the metallic hard mask portion 70P. The ILD layer 90 can be subsequently planarized, for example, by CMP. In one embodiment and as shown in FIG. 7, the planarization of the ILD 70 is performed using the metallic hard mask portion 70P as a planarization stop layer. Thus, after the planarization, the ILD layer 90 has a top surface coplanar with the top surface of the metallic hard mask portion 70P. The metallic hard mask portion 70P and the metal portion 60P together constitute a top electrode for a MIEC-based memory cell access device. In another embodiment, the planarization of the ILD 90 also removes the metallic hard mask portion 70P completely from the structure. Thus, as shown in FIG. 8, after the planarization, the ILD layer 90 has a top surface coplanar with the top surface of the metal portion 60P. In this case, the metal portion 60P acts as a top electrode for a MIEC-based memory cell access device.

A MIEC-based memory cell access device for a memory cell is thus formed using a subtractive etch process. The MIEC-based memory cell access device includes a MIEC material portion 50P sandwiched between a bottom electrode 40 and a top electrode (60P or the combination of 60P and 70P). In the present application, since the MIEC material portion 50P is formed by a subtractive etch process, the contact area between the top electrode (60P or the combination of 60P and 70P) and the MIEC material portion 50P is substantially the same as the contact area between the bottom electrode 40 and the MIEC material portion 50P. That is, the contact area between the top electrode (60P or the combination of 60P and 70P) and the MIEC material portion 50P is no more than 20% greater than the contact area between the bottom electrode 40 and the MIEC material portion 50P. Due to the better symmetry with respect to the electrode contact areas, the resulting MIEC-based memory cell access device exhibits improved I-V characteristics and reduced low voltage leakage currents. In addition, since CMP process for the MIEC material is not needed in the subtractive etch process, surface defects caused by the CMP process can be eliminated. In the present application, the critical dimension (i.e., smallest allowable with) of the MIEC-based memory cell is defined by the lithograph tool. The subtractive etch process employed in the present application thus allows fabricating large numbers of devices for a given area.

Figure 9:
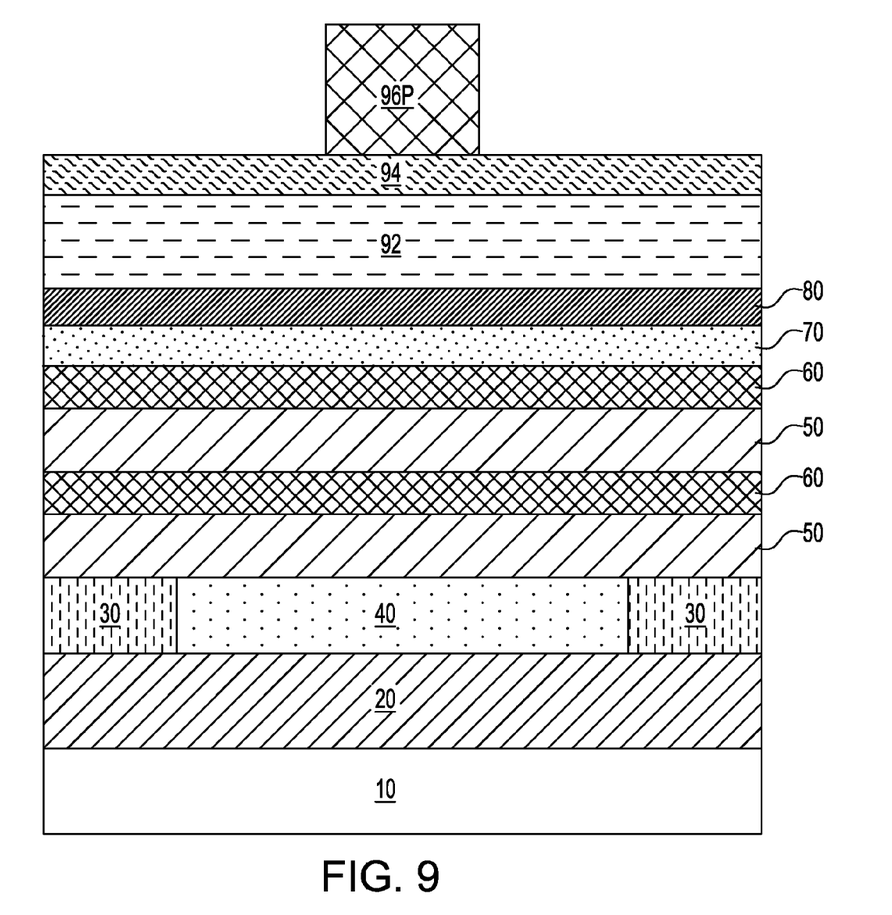
FIG. 9 is a cross-section view of a second exemplary semiconductor structure according to a second embodiment of the present application after forming a second material stack over a substrate; the second material stack includes, from bottom to top, a first dielectric material layer, a second dielectric material layer having a bottom electrode embedded there in, a stack of alternating MIEC material layers and metal layers, a metallic hard mask layer, a dielectric hard mask layer, an OPL, an antireflective hard mask layer, and a photoresist portion.

Referring to FIG. 9, a second exemplary semiconductor structure according to a second embodiment of the present application includes a second material stack formed over the substrate 10. The second material stack employed in the second embodiment of the present application has a similar structure to the first material stack in the first embodiment except that in the second embodiment a stack of alternating MIEC material layers 50 and metal layers 60 is formed between the bottom electrode 40 and the metallic hard mask layer 70. Specifically, the second material stack includes, from bottom to top, a first dielectric material layer 20, a second dielectric material layer 30 having a bottom electrode 40 embedded there in, a stack of alternating MIEC material layers 50 and metal layers 60, a metallic hard mask layer 70, a dielectric hard mask layer 80, an organic planarization layer (OPL) 92, an antireflective hard mask layer 94, and a photoresist portion 96P. In one embodiment and as shown in FIG. 9, the stack of alternating MIEC material layers 50 and metal layers 60 includes two pairs of MIEC material layer 50 and metal layers 60. Each component layer of the second material stack can have the same composition and range of thickness and can be fabricated using the same deposition process as described above in conjunction with the first material stack described above in FIG. 1, thus will not be described in detail herein.

Figure 10:
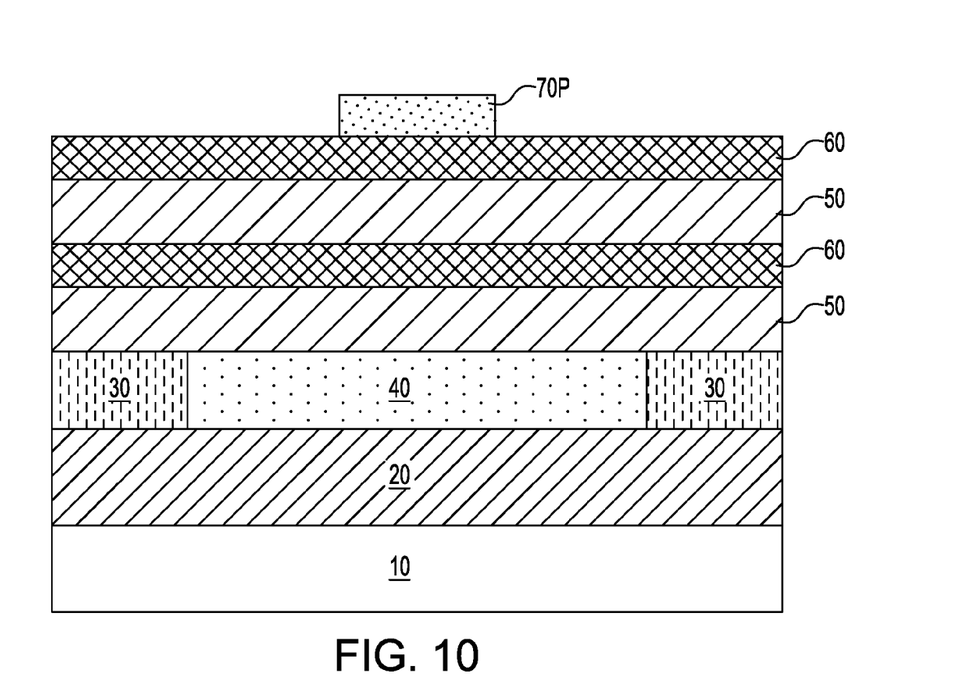
FIG. 10 is a cross-sectional view of the second exemplary semiconductor structure of FIG. 9 after forming a metallic hard mask portion by sequentially patterning the ARC layer, the OPL, the dielectric hard mask layer and the metallic hard mask layer and removing remaining portions of the antireflective hard mask layer, the OPL and the dielectric hard mask layer.

Referring to FIG. 10, processing steps described above in FIGS. 1-5 can be performed to provide a metallic hard mask portion 70P atop the topmost metal layer 60 in the stack of alternating MIEC material layers 50 and metal layers 60.

Figure 11:
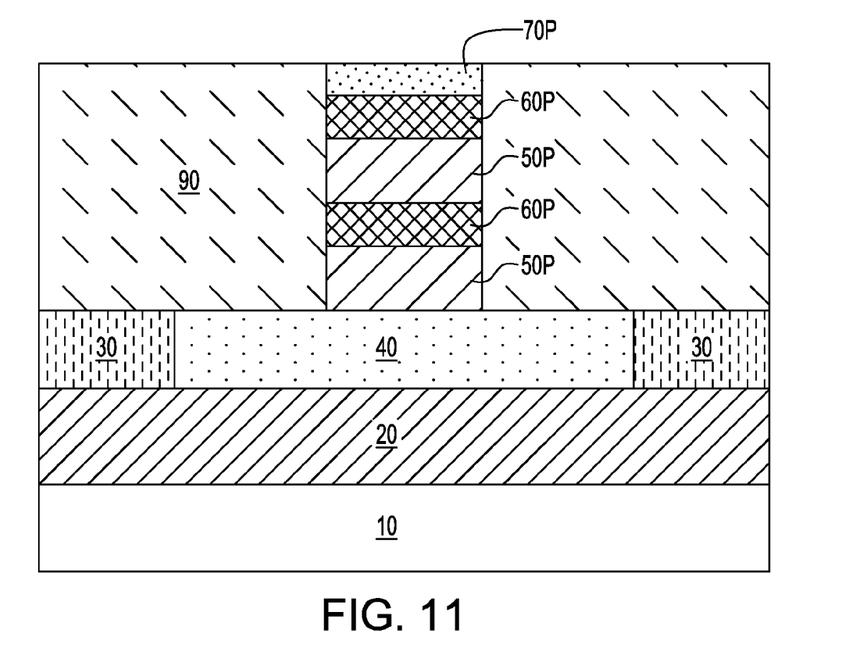
FIG. 11 is a cross-sectional view of the second exemplary semiconductor structure of FIG. 10 after simultaneously patterning the stack of alternating MIEC material layers and metal layers and forming the ILD layer.

Referring FIG. 11, the stack of alternating MIEC material layers 50 and metal layers 60 can be patterned simultaneously by performing the processing steps of FIG. 6 to provide a stack of alternating MIEC material portions 50P and metal portions 60P.

Next, the processing steps described above in FIG. 7 are performed to form an ILD layer 90 laterally surrounding the alternating MIEC material portions 50P and metal portions 60P and the metallic hard mask portion 70P, if present. When present, the metallic hard mask portion 70P and the topmost metal portion 60P together constitute a top electrode for a MIEC-based memory cell access device. If not present, the topmost metal portion 60P acts as a top electrode for a MIEC-based memory cell access device.

A MIEC-based memory cell access device is thus formed. The MIEC-based memory cell access device includes vertically stacked MIEC material portions 50P sandwiched between a bottom electrode 40 and a top electrode. The vertically stacked MIED material portions 50P are separated from one another by metal portions 60P. In the second embodiment, the access device with vertically stacked MIEC material portions 50P exhibits a higher MIEC voltage margin than the access device with a single MIEC material portion 60P, which enables driving larger sizes of memory arrays. In addition, since the stack of alternating MIEC material layers 50 and metal layers 60 can be etched in a single etch step, no additional processing step is needed in the second embodiment compared to the first embodiment.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising a memory cell access device, the memory cell access device comprising:
    a mixed-ionic electronic conductor (MIEC) material portion located between a bottom electrode and a top electrode, wherein sidewalls of the top electrode are offset from sidewalls of the bottom electrode, and wherein a contact area between the MIEC material portion and the bottom electrode is substantially the same as a contact area between the MIEC material portion and the top electrode; and
    a dielectric material layer laterally surrounding the bottom electrode, wherein the dielectric material layer has a same thickness as the bottom electrode.

2. The semiconductor structure of claim 1, wherein sidewalls of the MIEC material portion are vertically aligned with the sidewalls of the top electrode.

3. The semiconductor structure of claim 2, wherein the sidewalls of the MIEC material portion are offset from the sidewalls of the bottom electrode.

4. The semiconductor structure of claim 1, wherein the MIEC material portion comprises a material represented by a formula of $M_aX_bY_c$, wherein:
    M is selected from the group consisting of Cu, Ag, Li and Zn,
    X is selected from the group consisting of Ge, Si, Sn, C, Cr, Mo and W, and
    Y is selected from the group consisting of S, Se, Te or O, and
    wherein a is from 20 to 70 atomic %, b is from 4 to 30 atomic %, and c is from 30 to 60 atomic %.

5. The semiconductor structure of claim 4, wherein the MIEC material portion comprises $Cu_8GeS_6$ or $Cu_8GeSe_6$.

6. The semiconductor structure of claim 1, wherein the bottom electrode comprises TiN, TaN, W, Al, Cu, Ag, Ir, Pt, Au, Co or Ni.

7. The semiconductor structure of claim 1, wherein the top electrode comprises a metal portion in direct contact with the MIEC material portion, the metal portion comprising Ru, Cu, Ag, Au, Ni, Fe, Pt, Pd, W, Ir or Co.

8. The semiconductor structure of claim 7, wherein the top electrode further comprises a metallic hard mask portion atop the metal portion, the metallic hard mask portion comprising TiN, TaN, WN or an alloy thereof.

9. The semiconductor structure of claim 1, further comprising an interlevel dielectric layer laterally surrounding the MIEC material portion and the top electrode.

10. A semiconductor structure comprising a memory cell access device, the memory cell access device comprising:
    a bottom electrode;
    vertically stacked mixed ion electron conductor (MIEC) material portions located over the bottom electrode, wherein the MIEC material portions are separated from one another by metal portions, and a bottommost MIEC material portion in the vertically stacked MIEC material portions is in direct contact with the bottom electrode; and
    a top electrode located on and in direct contact with a topmost MIEC material portion in the vertically stacked MIEC material portions.

11. The semiconductor structure of claim 10, wherein a contact area between the bottommost MIEC material portion and the bottom electrode is substantially the same as a contact area between the topmost MIEC material portion and the top electrode.

12. The semiconductor structure of claim 10, wherein sidewalls of the vertically stacked MIEC material portions and the metal portions are vertically aligned with side walls of top electrode.

13. The semiconductor structure of claim 12, wherein the sidewalls of the vertically stacked MIEC material portions and the metal portions are offset from sidewalls of the bottom electrode.

14. The semiconductor structure of claim 10, wherein the top electrode comprises a topmost metal portion atop the topmost MIEC material portion and a metallic hard mask portion atop the topmost metal portion.

15. The semiconductor structure of claim 14, wherein each of the metal portions and the topmost metal portion comprises Ru, Cu, Ag, Au, Ni, Fe, Pt, Pd, W, Ir or Co.

16. The semiconductor structure of claim 14, wherein the metallic hard mask portion comprises TiN, TaN, WN or an alloy thereof.

17. The semiconductor structure of claim 10, wherein each of the MIEC material portions in the stack comprises a material represented by a formula of $M_aX_bY_c$, wherein:
- M is selected from the group consisting of Cu, Ag, Li and Zn,
- X is selected from the group consisting of Ge, Si, Sn, C, Cr, Mo and W, and
- Y is selected from the group consisting of S, Se, Te or O, and
- wherein a is from 20 to 70 atomic %, b is from 4 to 30 atomic %, and c is from 30 to 60 atomic %.

18. The semiconductor structure of claim 10, wherein the bottom electrode comprises TiN, TaN, W, Al, Cu, Ag, Ir, Pt, Au, Co or Ni.

19. The semiconductor structure of claim 10, wherein the bottom electrode is laterally surrounded by an entirety of a dielectric material layer, the dielectric material layer having a top surface coplanar with a top surface of the bottom electrode.

* * * * *